(12) United States Patent
Mishima

(10) Patent No.: US 10,878,753 B2
(45) Date of Patent: Dec. 29, 2020

(54) ORGANIC ELECTROLUMINESCENT PANEL AND LUMINESCENT UNIT

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/865,449

(22) Filed: Jan. 9, 2018

(65) Prior Publication Data

US 2018/0233088 A1 Aug. 16, 2018

(30) Foreign Application Priority Data

Feb. 10, 2017 (JP) .................................. 2017-023162

(51) Int. Cl.
| | |
|---|---|
| G09G 3/3258 | (2016.01) |
| H01L 51/50 | (2006.01) |
| H01L 27/32 | (2006.01) |
| H01L 51/52 | (2006.01) |
| G09G 3/3225 | (2016.01) |

(52) U.S. Cl.
CPC ......... *G09G 3/3258* (2013.01); *G09G 3/3225* (2013.01); *H01L 27/3246* (2013.01); *H01L 27/3276* (2013.01); *H01L 27/3283* (2013.01); *H01L 51/5056* (2013.01); *H01L 51/5203* (2013.01); *H01L 51/5253* (2013.01); *G09G 2300/0426* (2013.01); *G09G 2300/0452* (2013.01); *G09G 2310/0264* (2013.01); *H01L 2227/323* (2013.01)

(58) Field of Classification Search
CPC ............... G09G 3/3258; G09G 3/3225; G09G 2300/0452; G09G 2300/0426; G09G 2310/0264; H01L 51/5253; H01L 27/3283; H01L 27/3276; H01L 51/5203; H01L 51/5056; H01L 27/3246; H01L 2227/323

See application file for complete search history.

(56) References Cited

U.S. PATENT DOCUMENTS

| | | | |
|---|---|---|---|
| 2003/0017360 A1* | 1/2003 | Tai | H01L 27/3246 |
| | | | 428/690 |
| 2007/0159068 A1 | 7/2007 | Miyake | |

(Continued)

FOREIGN PATENT DOCUMENTS

| | | |
|---|---|---|
| JP | 2008-270117 A | 11/2008 |
| JP | 2010-44902 A | 2/2010 |

(Continued)

OTHER PUBLICATIONS

John Fahlteich, Matthias Fahland, Waldemar Schönberger, Nicolas Schiller; "Permeation barrier properties of thin oxide films on flexible polymer substrates"; Thin Solid Films, vol. 517, Issue 10, Mar. 31, 2009, pp. 3075-3080 (Year: 2009).*

*Primary Examiner* — Abhishek Sarma
(74) *Attorney, Agent, or Firm* — Xsensus LLP

(57) ABSTRACT

An organic electroluminescent panel includes a plurality of partition walls, an organic light-emitting layer, and a protective layer. The plurality of partition walls define a pixel region, and include an organic material. The organic light-emitting layer crosses over the plurality of partition walls. The protective layer is disposed between each of the partition walls and the organic light-emitting layer, and has a moisture permeability lower than a moisture permeability of any of the partition walls.

11 Claims, 5 Drawing Sheets

(56) References Cited

U.S. PATENT DOCUMENTS

| | | | |
|---|---|---|---|
| 2008/0303424 A1 | 12/2008 | Mitsuya et al. | |
| 2010/0213827 A1* | 8/2010 | Yoshida | H01L 27/3246 313/504 |
| 2011/0018007 A1* | 1/2011 | Kasahara | H01L 27/3246 257/88 |
| 2011/0241027 A1* | 10/2011 | Kaneta | H01L 27/3246 257/88 |
| 2012/0205698 A1 | 8/2012 | Yamazaki et al. | |
| 2013/0169145 A1* | 7/2013 | Adachi | H01L 27/3246 313/498 |
| 2017/0162638 A1* | 6/2017 | Nendai | H01L 27/322 |
| 2018/0342563 A1* | 11/2018 | You | H01L 27/3246 |

FOREIGN PATENT DOCUMENTS

| | | |
|---|---|---|
| JP | 2011-216267 A | 10/2011 |
| JP | 2016-024887 A | 2/2016 |
| JP | 2016-157645 A | 9/2016 |
| JP | 2016-164893 A | 9/2016 |
| WO | 2004/107821 A1 | 12/2004 |

\* cited by examiner

ORGANIC ELECTROLUMINESCENT PANEL AND LUMINESCENT UNIT

CROSS REFERENCE TO RELATED APPLICATIONS

This application claims the benefit of Japanese Priority Patent Application JP2017-023162 filed Feb. 10, 2017, the entire contents of which are incorporated herein by reference.

BACKGROUND

The disclosure relates to an organic electroluminescent panel and a luminescent unit. There is known a method of manufacturing an organic electroluminescent panel by forming an organic electroluminescent element with respect to each pixel using an inkjet device. This method allows for forming the organic electroluminescent element by, for example, discharging an ink droplet from the inkjet device into a groove surrounded by a partition wall and then drying the discharged ink. Examples of the partition wall are described in, for example, Japanese Unexamined Patent Application Publication Nos. 2016-164893, 2016-157645, and 2016-24887.

SUMMARY

A partition wall is typically made of an organic material. The partition wall may thus absorb moisture in a process of forming an organic electroluminescent element and the absorbed moisture may cause a failure in the organic electroluminescent element.

It is desirable to provide an organic electroluminescent panel and a luminescent unit that make it possible to suppress any adverse effect due to moisture absorbed by a partition wall.

An organic electroluminescent panel according to an embodiment of the disclosure includes: a plurality of partition walls that define a pixel region, and including an organic material; an organic light-emitting layer that crosses over the plurality of partition walls; and a protective layer disposed between each of the partition walls and the organic light-emitting layer, and having a moisture permeability lower than a moisture permeability of any of the partition walls.

A luminescent unit according to an embodiment of the disclosure includes: an organic electroluminescent panel; and a driver that drives the organic electroluminescent panel. The organic electroluminescent panel includes a plurality of partition walls that define a pixel region, and including an organic material, an organic light-emitting layer that crosses over the plurality of partition walls, and a protective layer disposed between each of the partition walls and the organic light-emitting layer, and having a moisture permeability lower than a moisture permeability of any of the partition walls.

DETAILED DESCRIPTION

Figure 1:
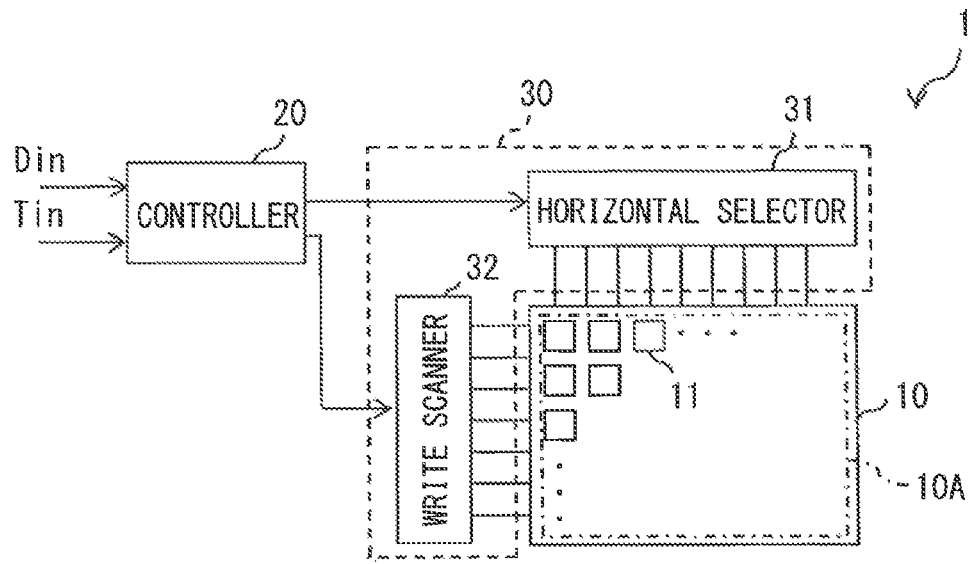
FIG. 1 is a schematic diagram illustrating an exemplary general configuration of an organic electroluminescent unit according to an embodiment of the disclosure.

In the following, some example embodiments of the disclosure are described in detail, in the following order, with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

Embodiment

[Configuration]

Figure 2:
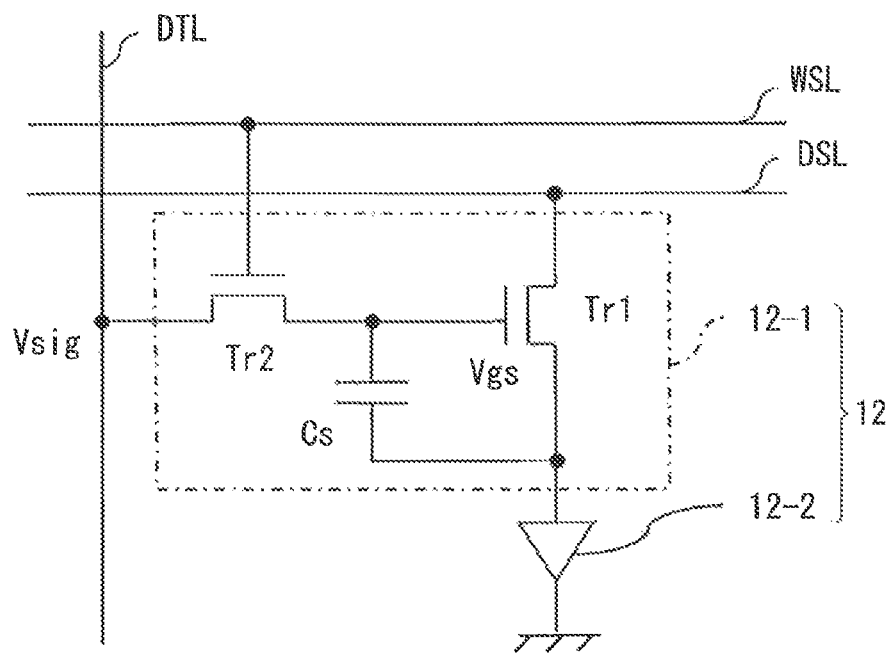
FIG. 2 is a schematic diagram illustrating an exemplary circuit configuration of a subpixel included in each pixel in FIG. 1.

FIG. 1 illustrates an exemplary general configuration of an organic electroluminescent unit 1 according to an embodiment of the disclosure. FIG. 2 illustrates an example of a circuit configuration of a subpixel 12 included in each pixel 11 provided in the organic electroluminescent unit 1. The organic electroluminescent unit 1 may include, for example, an organic electroluminescent panel 10, a controller 20, and a driver 30. The driver 30 may be mounted on, for example, an outer edge of the organic electroluminescent panel 10. The organic electroluminescent panel 10 may include a plurality of pixels 11 arranged in a matrix form in a pixel region 10A. The controller 20 and the driver 30 may drive the organic electroluminescent panel 10 on the basis of an image signal Din and a synchronizing signal Tin inputted from outside.

[Organic Electroluminescent Panel 10]

The organic electroluminescent panel 10 may display an image on the basis of the image signal Din and the synchronizing signal Tin inputted from the outside by each pixel 11 being driven as an active matrix by the controller 20 and the driver 30. The organic electroluminescent panel 10 may include a plurality of scanning lines WSL extending in a row direction, a plurality of signal lines DTL and a plurality of power lines DSL extending in a column direction, and the plurality of pixels 11 arranged in a matrix form.

The scanning line WSL may be used for selection of each pixel 11, and may supply the pixel 11 with a selection pulse for selecting the pixel 11 with respect to each predetermined unit (for example, each pixel row). The signal line DTL may be used to supply each pixel 11 with a signal voltage Vsig corresponding to the image signal Din, and may supply the pixel 11 with a data pulse that includes the signal voltage Vsig. The power line DSL may supply each pixel 11 with electric power.

Each pixel 11 may include, for example, a subpixel 12 emitting a red light, a subpixel 12 emitting a green light, and a subpixel 12 emitting a blue light. It should be noted that each pixel 11 may further include, for example, a subpixel 12 that emits a light of another color (such as white and yellow). In each pixel 11, the plurality of subpixels 12 may be arranged in line in a predetermined direction, for example.

Each signal line DTL may be coupled to an output terminal of a horizontal selector 31 to be described later. Allocated to each pixel column may be, for example, one of the plurality of signal lines DTL. Each scanning line WSL may be coupled to an output terminal of a write scanner 32 to be described later. Allocated to each pixel row may be, for example, one of the plurality of scanning lines WSL. Each power line DSL may be coupled to an output terminal of a power supply. Allocated to each pixel row may be, for example, one of the plurality of power lines DSL.

Each subpixel 12 may include a pixel circuit 12-1 and an organic electroluminescent element 12-2. A configuration of the organic electroluminescent element 12-2 will be described later in detail.

The pixel circuit 12-1 may control light emission and extinction of the organic electroluminescent element 12-2. The pixel circuit 12-1 may have a capability of holding a voltage written to each subpixel 12 by writing scanning to be described later. The pixel circuit 12-1 may include, for example, a driving transistor Tr1, a switching transistor Tr2, and a storage capacitor Cs.

The switching transistor Tr2 may control application of the signal voltage Vsig corresponding to the image signal Din to a gate of the driving transistor Tr1. The switching transistor Tr2 may sample a voltage on the signal line DTL and write the voltage obtained from the sampling to the gate of the driving transistor Tr1. The driving transistor Tr1 may be coupled to the organic electroluminescent element 12-2 in series. The driving transistor Tr1 may drive the organic electroluminescent element 12-2. The driving transistor Tr1 may control a current flowing through the organic electroluminescent element 12-2 on the basis of a magnitude of the voltage sampled by the switching transistor Tr2. The storage capacitor Cs may store a predetermined voltage between a gate and a source of the driving transistor Tr1. The storage capacitor Cs may store a gate-source voltage Vgs of the driving transistor Tr1 at a constant level during a predetermined period. It should be noted that the pixel circuit 12-1 may have a circuit configuration including various capacitors and transistors added to the 2Tr1C circuit or a circuit configuration different from the 2Tr1C circuit configuration.

Each signal line DTL may be coupled to an output terminal of the horizontal selector 31 to be described later as well as a source or a drain of the switching transistor Tr2. Each scanning line WSL may be coupled to an output terminal of the write scanner 32 to be described later as well as the gate of the switching transistor Tr2. Each power line DSL may be coupled to a power circuit as well as the source or a drain of the driving transistor Tr1.

The gate of the switching transistor Tr2 may be coupled to the scanning line WSL. The source or the drain of the switching transistor Tr2 may be coupled to the signal line DTL. One of the source and the drain of the switching transistor Tr2 that is not coupled to the signal line DTL may be coupled to the gate of the driving transistor Tr1. The source or the drain of the driving transistor Tr1 may be coupled to the power line DSL. One of the source and the drain of the driving transistor Tr1 that is not coupled to the power line DSL may be coupled to an anode 21 of the organic electroluminescent element 12-2. One terminal of the storage capacitor Cs may be coupled to the gate of the driving transistor Tr1. Another terminal of the storage capacitor Cs may be coupled to one of the source and the drain of the driving transistor Tr1 that is on the side of the organic electroluminescent element 12-2.

[Driver 30]

The driver 30 may include, for example, the horizontal selector 31 and the write scanner 32.

The horizontal selector 31 may apply, for example, the analogue signal voltage Vsig inputted from the controller 20 to each signal line DTL on the basis of (in synchronization with) an input of a control signal. The write scanner 32 may scan the plurality of subpixels 12 with respect to each predetermined unit.

[Controller 20]

The controller 20 is described below. The controller 20 may, for example, perform a predetermined correction on a digital image signal Din inputted from the outside, and generate the signal voltage Vsig on the basis of the image signal obtained by the correction. The controller 20 may output, for example, the generated signal voltage Vsig to the horizontal selector 31. The controller 20 may output, for example, the control signal to each circuit in the driver 30 on the basis of (in synchronization with) the synchronizing signal Tin inputted from the outside.

Figure 3:
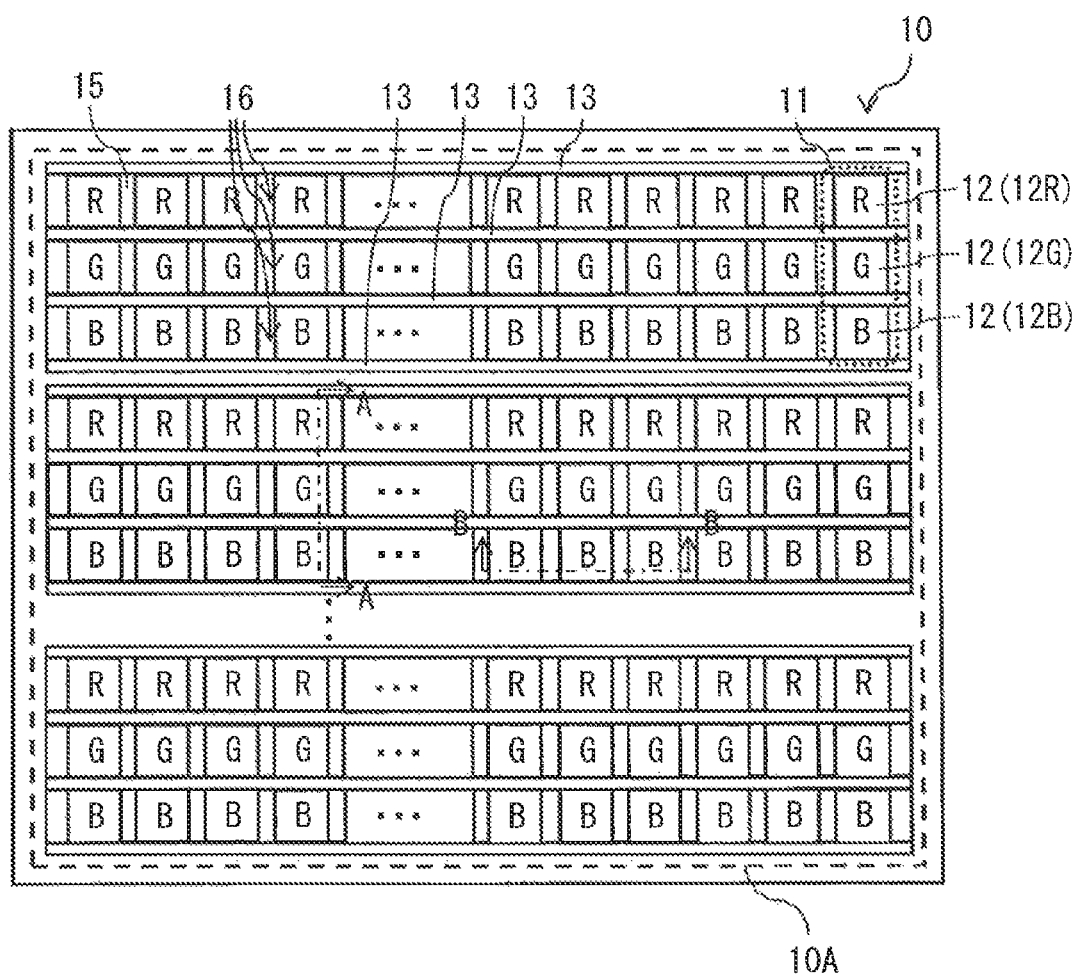
FIG. 3 is a schematic diagram illustrating an exemplary general configuration of the organic electroluminescent panel in FIG. 1.
Figure 4:
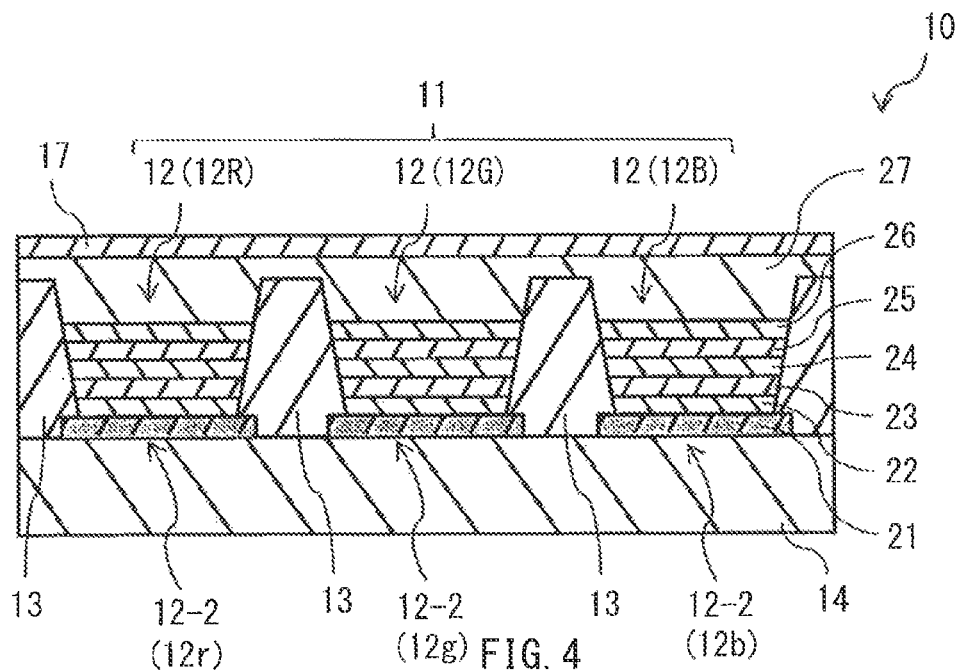
FIG. 4 is a schematic diagram illustrating an exemplary cross-sectional configuration of the organic electroluminescent panel taken along A-A in FIG. 3.
Figure 5:
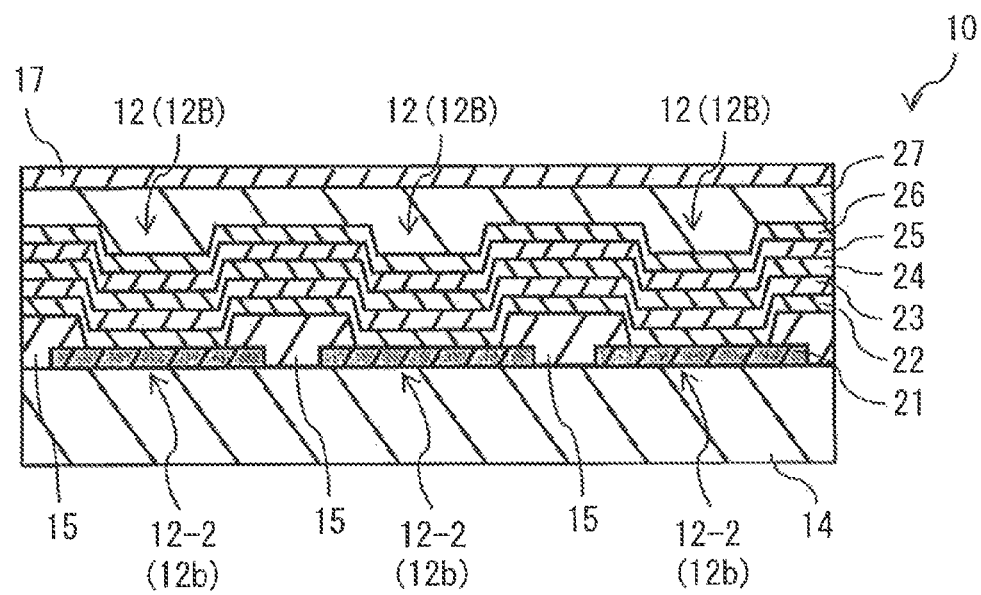
FIG. 5 is a schematic diagram illustrating an exemplary cross-sectional configuration of the organic electroluminescent panel taken along B-B in FIG. 3.

The organic electroluminescent element 12-2 is now described with reference to FIGS. 3, 4, and 5. FIG. 3 illustrates an exemplary general configuration of the organic electroluminescent panel 10. FIG. 4 illustrates an exemplary cross-sectional configuration of the organic electroluminescent panel 10 taken along A-A in FIG. 3. FIG. 5 illustrates an exemplary cross-sectional configuration of the organic electroluminescent panel 10 taken along B-B in FIG. 3.

The organic electroluminescent panel 10 may include the plurality of pixels 11 arranged in a matrix form. Each pixel 11 may include, for example, the subpixel 12 (12R) emitting the red light, the subpixel 12 (12G) emitting the green light, and the subpixel 12 (12B) emitting the blue light, as described above. The subpixel 12R may include the organic electroluminescent element 12-2 (12*r*) emitting the red light. The subpixel 12G may include the organic electroluminescent element 12-2 (12*g*) emitting the green light. The subpixel 12B may include the organic electroluminescent element 12-2 (12*b*) emitting the blue light. The subpixels 12R, 12G, and 12B may be arranged in a stripe form, for example. In each pixel 11, the subpixels 12R, 12G, and 12B may be arranged, for example, in the column direction. Furthermore, in each pixel row, for example, the plurality of subpixels 12 emitting the light of the same color may be arranged in line in the row direction.

The organic electroluminescent panel 10 may include, on a substrate 14, a plurality of line banks 13 extending in the row direction and a plurality of banks 15 extending in the column direction. The plurality of line banks 13 and the plurality of banks 15 may define the pixel region 10A. The bank 15 may correspond to a specific but non-limiting example of a "partition wall" in one embodiment of the disclosure. The plurality of line banks 13 may define each subpixel 12 in each pixel 11. The plurality of banks 15 may define each pixel 11 in each pixel row. In other words, the plurality of subpixels 12 may be defined by the plurality of line banks 13 and the plurality of banks 15. Each bank 15 may be provided between two line banks 13 adjacent to each other in the column direction. Both ends of each bank 15 may be coupled to two line banks 13 adjacent to each other in the column direction.

The substrate 14 may include, for example, a base that supports each organic electroluminescent element 12-2, each line bank 13, and each bank 15, and a wiring layer provided on the base. The base in the substrate 14 may include, for example, a glass substrate, or a flexible substrate. Examples of the material of the glass substrate used as the base in the substrate 14 may include alkali-free glass, soda glass, non-luminescent glass, phosphate glass, borate glass, and quartz. Examples of the material of the flexible substrate used as the base in the substrate 14 may include acrylic-based resin, styrene-based resin, polycarbonate-based resin, epoxy-based resin, polyethylene, polyester, and silicone-based resin. Provided on the wiring layer in the substrate 14 may be, for example, the pixel circuit 12-1 of each pixel 11. The substrate 14 may be in contact with bottom surfaces of the plurality of banks 15 and may support the plurality of banks 15.

The line bank 13 and the bank 15 may include, for example, an insulating organic material. Examples of the insulating organic material may include acrylic-based resin, polyimide-based resin, and novolac-based phenolic resin. The line bank 13 and the bank 15 may be preferably made of, for example, an insulating resin resistant to heat and solvent. The line bank 13 and the bank 15 may be formed by, for example, processing the insulating resin into a desired pattern by photolithography and development. A cross-sectional shape of the line bank 13 may be, for example, a forward tapered shape as illustrated in FIG. 4, or a reverse tapered shape with its lower side being narrower than its upper side. A cross-sectional shape of the bank 15 may be, for example, a forward tapered shape as illustrated in FIG. 5, or a reverse tapered shape with its lower side being narrower than its upper side.

A region surrounded by two line banks 13 parallel to each other and adjacent to each other and banks 15 at both ends may be a groove 16. Furthermore, a region surrounded by two line banks 13 parallel to each other and adjacent to each other and two banks 15 parallel to each other and adjacent to each other may correspond to the subpixel 12. In other words, each organic electroluminescent element 12-2 may be placed, in a one-by-one fashion, in each region surrounded by two line banks 13 parallel to each other and adjacent to each other and two banks 15 parallel to each other and adjacent to each other.

Each organic electroluminescent element 12-2 may include, for example, the anode 21, a hole injection layer 22, a hole transport layer 23, a light-emitting layer 24, an electron transport layer 25, an electron-injection layer 26, and a cathode 27 in this order from the substrate 14 side. The light-emitting layer 24 may correspond to a specific but non-limiting example of a "light-emitting layer in one embodiment of the disclosure. The hole injection layer 22 may increase hole injection efficiency. The hole transport layer 23 may transport holes injected from the anode 21 to the light-emitting layer 24. The light-emitting layer 24 may emit light of a predetermined color by recombination of electrons and holes. The electron transport layer 25 may transport the electrons injected from the cathode 27 to the light-emitting layer 24. The electron-injection layer 26 may increase the electron injection efficiency. The hole injection layer 22, the electron-injection layer 26, or both may be omitted. Each organic electroluminescent element 12-2 may further include other layers than those described above.

The anode 21 may be provided on, for example, the substrate 14. Furthermore, the anode 21 may be formed so that, for example, an end edge of the anode 21 is embedded in the line bank 13 and the bank 15. Thus, the end edge of the anode 21 may be located below, or may be located immediately below, each line bank 13 and the bank 15. In one subpixel row, the plurality of anodes 21 may be disposed, for example, at equal intervals in an extending direction of the groove 16. One bank 15 may be disposed between each pair of two anodes 21 adjacent to each other in the extending direction of the groove 16. The anode 21 may be a transparent electrode having translucency, for which a transparent conductive film made of a transparent conductive material such as ITO (Indium Tin Oxide) and IZO (Indium Zinc Oxide) may be used. It should be noted that the anode 21 is not limited to the transparent electrode but may be made of, for example, aluminum (Al), silver (Ag), an alloy of aluminum or silver, or a reflective electrode having reflectivity. The anode 21 may be a lamination of the reflective electrode and the transparent electrode.

The hole injection layer 22 may have a capability of promoting injection of holes from the anode 21 to the light-emitting layer 24. The hole injection layer 22 may include an oxide of, for example, silver (Ag), molybdenum (Mo), chromium (Cr), vanadium (V), tungsten (W), nickel (Ni), or iridium (Ir).

The hole transport layer 23 may have a capability of transporting holes injected from the anode 21 to the light-emitting layer 24. The hole transport layer 23 may be, for example, a coating layer. The hole transport layer 23 may be formed by, for example, coating and drying a solution including an organic material having a hole transport property (hereinbelow, referred to as "hole transport material 23M") as a main solute. The hole transport layer 23 may include the hole transport material 23M as a main component.

Examples of the hole transport material 23M used as a raw material (material) of the hole transport layer 23 may include arylamine derivative, triazole derivative, oxadiazole derivative, imidazole derivative, polyaryl alkane derivative, pyrazoline derivative and pyrazolone derivative, phenylene-diamine derivative, amino-substituted chalcone derivative, oxazole derivative, styrylanthracene derivative, fluorenone derivative, hydrazone derivative, stilbene derivative, butadiene compound, polystyrene derivative, triphenylmethane derivative, tetraphenyl benzine derivative, and any combination thereof. The hole transport material 23M may further include in its molecular structure, for example, a soluble group and an insolubilizing group such as a thermal dissociation soluble group, a crosslinkable group, and a desorption protecting group for the sake of solubility and insolubilization.

The light-emitting layer 24 may have a capability of emitting light of a predetermined color by recombination of electrons and holes. The light-emitting layer 24 may be a coating layer. The light-emitting layer 24 may be formed by coating and drying a solution including an organic material that generates excitons to emit the light by recombination of electrons and holes (hereinbelow, referred to as "organic light-emitting material 24M") as a main solute. The light-emitting layer 24 may include the organic light-emitting material 24M as a main component. In the organic electroluminescent element 12r included in the subpixel 12R, the organic light-emitting material 24M may include a red organic light-emitting material. In the organic electroluminescent element 12g included in the subpixel 12G, the organic light-emitting material 24M may include a green organic light-emitting material. In the organic electroluminescent element 12b included in the subpixel 12B, the organic light-emitting material 24M may include a blue organic light-emitting material.

The light-emitting layer 24 may include, for example, a single-layered organic light-emitting layer or a plurality of laminated organic light-emitting layers. In a case where the light-emitting layer 24 is made of the plurality of laminated organic light-emitting layers, the light-emitting layer 24 may be a lamination of, for example, a plurality of organic light-emitting layers having a common main component. In this case, the plurality of organic light-emitting layers may be all coating layers. The plurality of organic light-emitting layers may all be formed by coating and drying a solution including the organic light-emitting material 24M as the main solute.

The organic light-emitting material 24M used as a raw material (material) of the light-emitting layer 24 may include, for example, a dopant material alone, and more preferably a combination of a host material and a dopant material. In other words, the light-emitting layer 24 may include the host material and the dopant material as the organic light-emitting material 24M. The host material may be responsible mainly for charge transport of electrons or holes, and the dopant material may be responsible for light emission. Each of the host material and the dopant material is not be limited to only one material but may be a combination of two or more different materials. An amount of the dopant material may be preferably no less than 0.01 wt. % and no more than 30 wt. % with respect to the host material, and more preferably no less than 0.01 wt. % and no more than 10 wt. % with respect to the host material.

Examples of the host material of the light-emitting layer 24 may include amine compound, condensed polycyclic aromatic compound, and heterocyclic compound. Examples of the amine compound may include monoamine derivative, diamine derivative, triamine derivative, and tetraamine derivative. Examples of the condensed polycyclic aromatic compound may include anthracene derivative, naphthalene derivative, naphthacene derivative, phenanthrene derivative, chrysene derivative, fluoranthene derivative, triphenylene derivative, pentacene derivative, and perylene derivative. Examples of the heterocyclic compound may include carbazole derivative, furan derivative, pyridine derivative, pyrimidine derivative, triazine derivative, imidazole derivative, pyrazole derivative, triazole derivative, oxazole derivative, oxadiazole derivative, pyrrole derivative, indole derivative, azaindole derivative, azacarbazole derivative, pyrazoline derivative, pyrazolone derivative, and phthalocyanine derivative.

Examples of the dopant material of the light-emitting layer 24 may include pyrene derivative, fluoranthene derivative, arylacetylene derivative, fluorene derivative, perylene derivative, oxadiazole derivative, anthracene derivative, and chrysene derivative. Furthermore, a metal complex may be used as the dopant material of the light-emitting layer 24. The metal complex may include, for example, a ligand and a metal atom such as iridium (Ir), platinum (Pt), osmium (Os), gold (Au), rhenium (Re), and ruthenium (Ru).

The electron transport layer 25 may have a capability of transporting electrons injected from the cathode 27 to the light-emitting layer 24. The electron transport layer 25 may be, for example, a coating layer. The electron transport layer 25 may include an organic material having an electron transport property (hereinbelow, referred to as "electron transport material 25M") as a main component.

The electron transport layer 25 may be interposed between the light-emitting layer 24 and the cathode 27, and may have a capability of transporting electrons injected from the cathode 27 to the light-emitting layer 24. The electron transport material 25M used as a raw material (material) of the electron transport layer 25 may be, for example, an aromatic heterocyclic compound including one or more heteroatoms in its molecule. The aromatic heterocyclic compound may be any compound that includes, for example, pyridine ring, pyrimidine ring, triazine ring, benzimidazole ring, phenanthroline ring, or quinazoline ring in its skeleton. Furthermore, the electron transport layer 25 may include a metal having an electron transport property. The electron transport layer 25 may improve the electron transport property of the electron transport layer 25 by including the metal having the electron transport property. Examples of the metal included in the electron transport layer 25 may include barium (Ba), lithium (Li), calcium (Ca), potassium (K), cesium (Cs), sodium (Na), rubidium (Rb), and ytterbium (Yb).

The cathode 27 may be, for example, a reflective electrode having light reflectivity, such as a metal electrode made of a metal material having reflectivity. Examples of a material of the cathode 27 may include aluminum (Al), magnesium (Mg), silver (Ag), aluminum-lithium alloy, and magnesium-silver alloy. It should be noted that the cathode 27 is not limited to the reflective electrode but may be a transparent electrode such as an ITO film as with the anode 21. In a case where the substrate 14 and the anode 21 have translucency and the cathode 27 has reflectivity, the organic electroluminescent element 12-2 may have a bottom emission structure that emits light from the substrate 14 side. In a case where the anode 21 has reflectivity and the cathode 27 has translucency, the organic electroluminescent element 12-2 has a top emission structure.

The organic electroluminescent panel 10 may further include, for example, a sealing layer 17 that seals each organic electroluminescent element 12-2. The sealing layer 17 may be in contact with a surface of the cathode 27 of the organic electroluminescent element 12-2.

A configuration of each bank 15 and its periphery is now described with reference to FIG. 5. As described above, in one subpixel row, the plurality of anodes 21 are disposed at equal intervals in an extending direction of the groove 16 (transverse direction in FIG. 5), for example. Each bank 15 may be disposed, in a one-by-one fashion, between each pair of anodes 21 adjacent to each other in the extending direction of the groove 16. In each groove 16, a lamination including the hole injection layer 22, the hole transport layer 23, the light-emitting layer 24, the electron transport layer 25, and the electron-injection layer 26 may extend in the extending direction of the groove 16. In other words, in each groove 16, the lamination including the hole injection layer 22, the hole transport layer 23, the light-emitting layer 24, the electron transport layer 25, and the electron-injection layer 26 may be formed to cross over a plurality of banks 15. Furthermore, in one subpixel row, subpixels 12 may share the hole injection layer 22, the hole transport layer 23, the light-emitting layer 24, the electron transport layer 25, and the electron-injection layer 26.

Now, the hole injection layer 22 may be formed between each bank 15 and the light-emitting layer 24. The hole injection layer 22 may further double as a protective layer having a lower moisture permeability than that of the bank 15. The hole injection layer 22 may cover an entire surface of a portion of each bank 15 that defines the plurality of subpixels 12. The hole injection layer 22 may be made of an inorganic material having a hole injection property. The inorganic material having the hole injection property may include an oxide (inorganic oxide) of, for example, silver (Ag), molybdenum (Mo), chromium (Cr), vanadium (V), tungsten (W), nickel (Ni), or iridium (Ir).

[Manufacturing Method]

A method of manufacturing the organic electroluminescent panel 10 is described below. FIGS. 6A to 6D illustrate an exemplary process of manufacturing the organic electroluminescent panel 10.

Figure 6A:
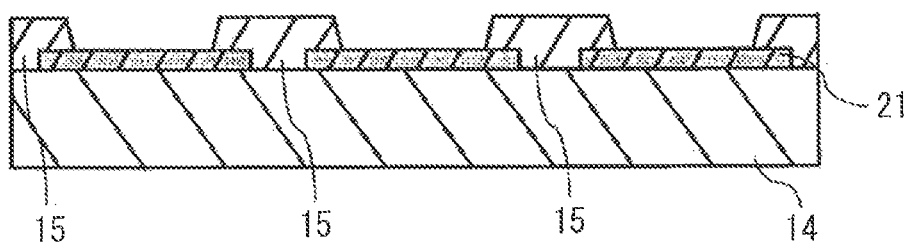
FIG. 6A is a schematic diagram illustrating an example of a process of manufacturing the organic electroluminescent panel in FIG. 5.

First, the plurality of anodes 21 may be provided on the substrate 14 in a matrix form with a predetermined gap interposed between them. The bank 15 extending in the column direction may be formed between each pair of anodes 21 adjacent to each other in the row direction (FIG. 6A). At this time, each bank 15 may be formed to cover the end edge of each anode 21. Thereafter, one line bank 13 extending in the row direction may be formed between each pair of anodes 21 adjacent to each other in the column direction. At this time, each line bank 13 may be formed to cover the end edge of each anode 21. This allows for forming the plurality of grooves 16 extending in the row direction one by one in each subpixel row.

Figure 6B:
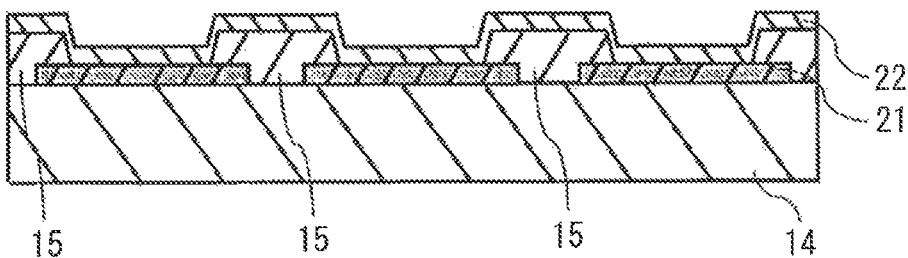
FIG. 6B is a schematic diagram illustrating an example of a process of manufacturing the organic electroluminescent panel following FIG. 6A.
Figure 6C:
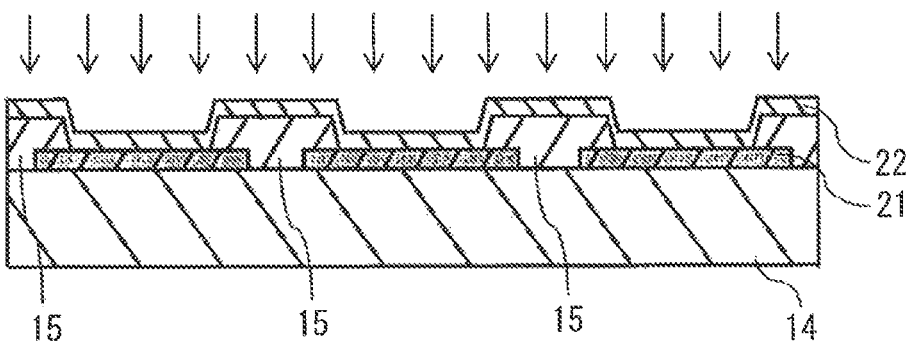
FIG. 6C is a schematic diagram illustrating an example of a process of manufacturing the organic electroluminescent panel following FIG. 6B.
Figure 6D:
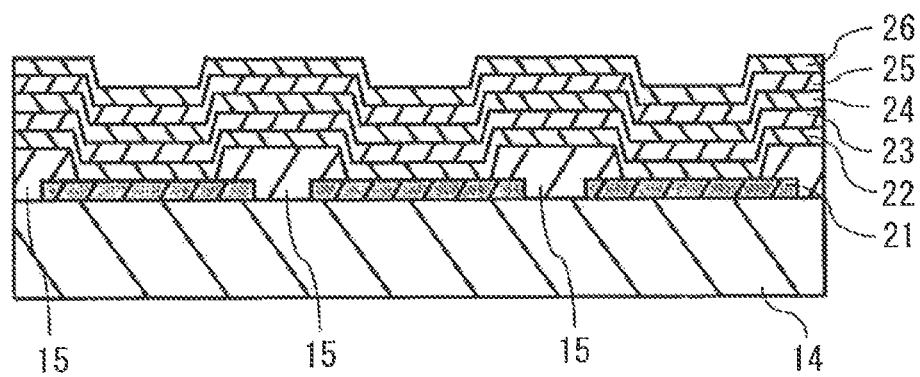
FIG. 6D is a schematic diagram illustrating an example of a process of manufacturing the organic electroluminescent panel following FIG. 6C.

Thereafter, the hole injection layer 22 may be formed on the surface of each anode 21 and each bank 15 that are exposed in each groove 16 using, for example, a vapor deposition technique (FIG. 6B). Thereafter, UV light may be applied onto the surface of each hole injection layer 22 (FIG. 6C). This may clean the surface of the hole injection layer 22 and improve wettability of the surface of each hole injection layer 22. At this time, each bank 15 is protected from the UV light by each hole injection layer 22. Thereafter, the hole transport layer 23 may be formed by, for example, discharging an ink droplet using an inkjet device into each groove 16, followed by drying the discharged ink. In a similar manner, the light-emitting layer 24, the electron transport layer 25, and the electron-injection layer 26 may be formed sequentially in each groove 16. This allows for forming the lamination including the hole injection layer 22, the hole transport layer 23, the light-emitting layer 24, the electron transport layer 25, and the electron-injection layer 26 in each groove 16 (FIG. 6D). Thereafter, the cathode 27 and the sealing layer 17 may be formed in this order. In this manner, the organic electroluminescent panel 10 including the organic electroluminescent element 12-2 with respect to each subpixel 12 may be formed.

[Effect]

Effects of the organic electroluminescent panel 10 according to the present embodiment and the organic electroluminescent unit 1 including the same are described below.

There is known a method of manufacturing an organic electroluminescent panel by forming an organic electroluminescent element with respect to each pixel using an inkjet device. This method allows for forming the organic electroluminescent element by, for example, discharging an ink droplet from the inkjet device into a groove surrounded by a partition wall and then drying the discharged ink. The partition wall is typically made of an organic material. The partition wall may thus absorb moisture in a process of forming the organic electroluminescent element and the absorbed moisture may cause a failure in the organic electroluminescent element.

In contrast, according to one embodiment, the hole injection layer 22 having a lower moisture permeability than that of the bank 15 is formed, as a layer that protects the bank 15, between the plurality of banks 15 and the light-emitting layer 24. The plurality of banks 15 define the pixel region 10A and include the organic material, and the light-emitting layer 24 is formed to cross over the plurality of banks 15. This makes it difficult for moisture to permeate the bank 15 compared with a case in which the layer is not formed to protect the bank 15, and makes it difficult for the moisture in the bank 15 to move to the light-emitting layer 24 even if the moisture has permeated the bank 15. As a result, it is possible to reduce a possibility of degrading the light-emitting layer 24 by the moisture from the bank 15, thereby suppressing any adverse effect due to the moisture absorbed by the bank 15.

Furthermore, according to one embodiment, the plurality of subpixels 12 may be arranged in line in the extending direction of the groove 16. Further, the plurality of subpixels 12 may be defined by the plurality of banks 15, and may share the light-emitting layer 24. In such a case, because each bank 15 is protected by the hole injection layer 22, it is possible to reduce the possibility of degrading the light-emitting layer 24 by the moisture from the bank 15 even if the subpixels 12 share the light-emitting layer 24. This makes it possible to suppress any adverse effect due to the moisture absorbed by the bank 15.

Moreover, according to one embodiment, the subpixels 12 may share the hole injection layer 22, and the hole injection layer 22 may double as the layer that protects the bank 15. This eliminates the necessity of forming another layer that protects the bank 15, which makes it possible to suppress an increase in manufacturing cost and suppress any adverse effect due to the moisture absorbed by the bank 15.

Furthermore, according to one embodiment, the hole injection layer 22 may cover an entire surface of the portion of each bank 15 that defines the plurality of subpixels 12. This makes it possible to reduce the possibility of degrading the light-emitting layer 24 by the moisture from the bank 15, thereby suppressing any adverse effect due to the moisture absorbed by the bank 15.

Moreover, according to one embodiment, the hole injection layer 22 may be made of an inorganic material. This makes it difficult for the moisture to permeate the hole injection layer 22, thereby reducing the possibility of degrading the light-emitting layer 24 by the moisture from the bank 15. This makes it possible to suppress any adverse effect due to the moisture absorbed by the bank 15.

Furthermore, according to one embodiment, the light-emitting layer 24 may be a coating layer. Therefore, in the process of manufacturing the light-emitting layer 24, for example, the moisture from the ink may possibly be absorbed by the bank 15 and other structures. However, in one embodiment, because the hole injection layer 2 functions as the protective layer that protects the bank 15, it is possible to reduce a possibility that the bank 15 and other structures absorb the moisture from the ink in the process of manufacturing the light-emitting layer 24. This makes it possible to suppress any adverse effect due to the moisture absorbed by the bank 15.

[Modifications]

Hereinbelow, modifications of the organic electroluminescent unit 1 according to the above embodiment are described.

[Modification A]

Figure 7:
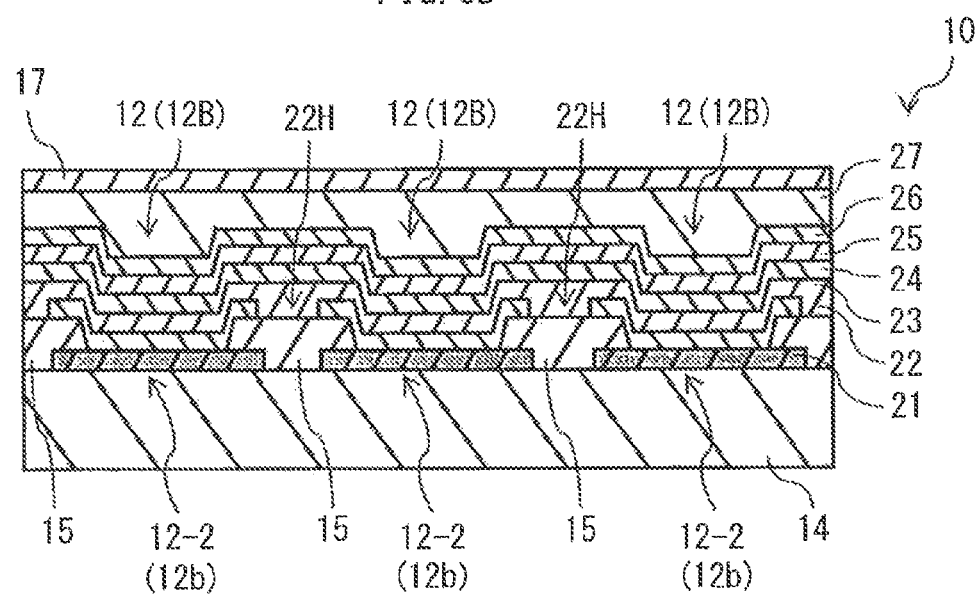
FIG. 7 is a schematic diagram illustrating a modification of the cross-sectional configuration of the organic electroluminescent panel in FIG. 5.

In the above embodiment, the hole injection layer 22 covers the entire surface of the portion of each bank 15 that defines the plurality of subpixels 12. However, in the above embodiment, the hole injection layer 22 may expose all or a portion of a top surface of each bank 15. For example, as illustrated in FIG. 7, the hole injection layer 22 may have one or more openings 22H on the top surface of each bank 15. In this case, the top surface of the bank 15 is exposed to the bottom surface of each opening 22H. The hole injection layer 22 according to the modification may be a lamination including an inorganic material layer made of the above-described inorganic oxide. The hole injection layer 22 according to the modification may be a lamination including, for example, the inorganic material layer made of the above-described inorganic oxide and an organic material layer made of a conductive polymer material such as PEDOT (mixture of polythiophene and polystyrene sulfonic acid) laminated in this order from the substrate 14 side.

The hole injection layer 22 according to the modification may expose all or a portion of the top surface of each bank 15. This makes it possible to reduce a possibility that the hole injection layer 22 is detached from the bank 15 due to the moisture in the bank 15 being collected at a portion where the bank 15 and the hole injection layer 22 contact each other. This makes it possible to suppress any adverse effect due to the moisture absorbed by the bank 15.

Furthermore, in the modification, in a case where the substrate 14 is a flexible substrate that is in contact with bottom surfaces of the plurality of banks 15 and supports the plurality of banks 15, moisture may possibly be absorbed by the bank 15 and other structures via the flexible substrate in the process of manufacturing the organic electroluminescent panel 10, for example. However, it is possible to release the moisture from each opening 22H in the hole injection layer 22, which makes it difficult for the moisture in the bank 15 to be collected at the portion where the bank 15 and the hole injection layer 22 contact each other. This makes it possible to reduce the possibility that the hole injection layer 22 is detached from the bank 15, thus suppressing any adverse effect due to the moisture absorbed by the bank 15.

[Modification B]

Figure 8:
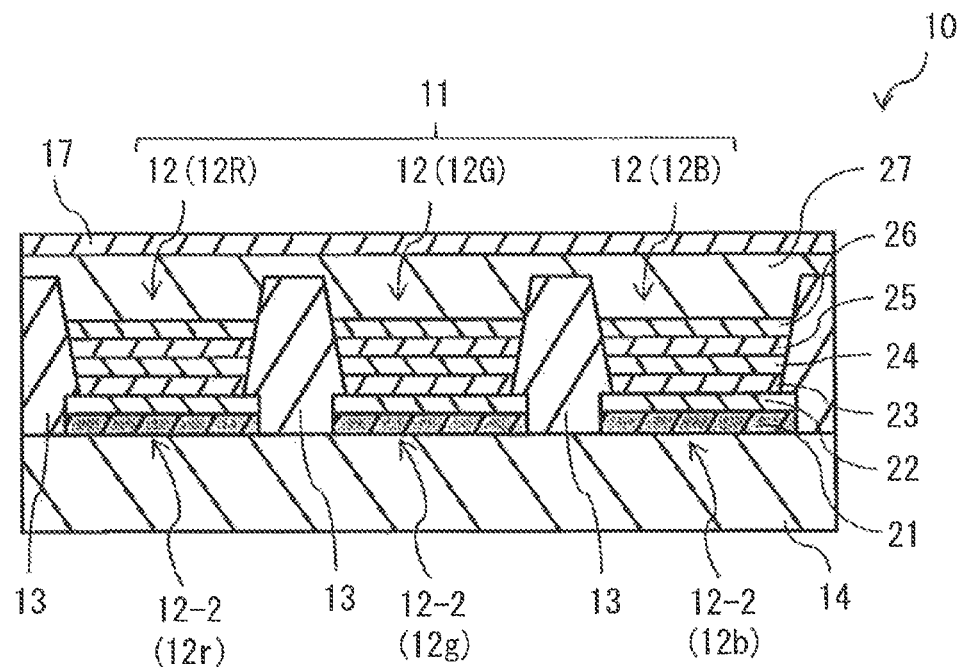
FIG. 8 is a schematic diagram illustrating a modification of the cross-sectional configuration of the organic electroluminescent panel in FIG. 4.
Figure 9:
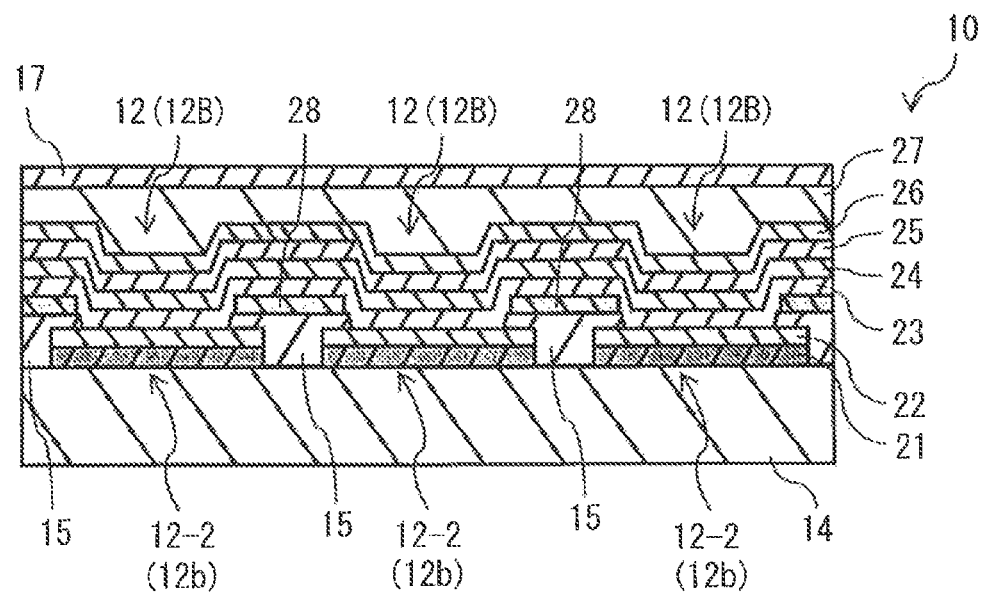
FIG. 9 is a schematic diagram illustrating a modification of the cross-sectional configuration of the organic electroluminescent panel in FIG. 5.

In the above embodiment, the hole injection layer 22 doubles as the layer that protects the bank 15. However, the layer that protects the bank 15 may be provided separately from each hole injection layer 22. For example, as illustrated in FIGS. 8 and 9, each hole injection layer 22 may be formed with its end embedded in the bank 15 and a protective layer 28 may be formed separately from each hole injection layer 22. The protective layer 28 may be formed between the bank 15 and the light-emitting layer 24, and may include a material having a lower moisture permeability than that of the bank 15. The protective layer 28 may include, for example, a metal material such as silver (Ag), molybdenum (Mo), chromium (Cr), vanadium (V), tungsten (W), and nickel (Ni). The protective layer 28 may expose all or a portion of a side surface of each bank 15. The protective layer 28 may be provided on the top surface of each bank 15, for example, avoiding the side surface of each bank 15. The hole injection layer 22 according to the modification may include the above-described inorganic oxide, or may include the conductive polymer material such as PEDOT (mixture of polythiophene and polystyrene sulfonic acid).

According to the modification, each hole injection layer 22 is formed with its end embedded in the bank 15, and the protective layer 28 is formed separately from each hole injection layer 22. This makes it possible to use any material suitable for the protective layer 28 even if the material is not suitable for the hole injection layer 22. As a result, it is possible to reduce the possibility that the light-emitting layer 24 may be degraded by the moisture from the bank 15, thus suppressing any adverse effect due to the moisture absorbed by the bank 15.

Furthermore, the protective layer 28 according to the modification exposes all or a portion of the side surface of each bank 15. This makes it possible to reduce the possibility that the hole injection layer 22 is detached from the bank 15 due to the moisture in the bank 15 being collected at a portion where the bank 15 and the hole injection layer 22 contact each other. This makes it possible to suppress any adverse effect due to the moisture absorbed by the bank 15.

Moreover, in the modification, in a case where the hole injection layer 22 includes the inorganic material, it may be difficult for moisture to permeate the hole injection layer 22, which makes it possible to reduce the possibility of degrading the light-emitting layer 24 by the moisture from the bank 15. This makes it possible to suppress any adverse effect due to the moisture absorbed by the bank 15.

Furthermore, in the modification, in a case where the protective layer 28 is made of the metal material, it is possible to reduce the possibility of degrading the light-emitting layer 24 by the moisture from the bank 15. This makes it possible to suppress any adverse effect due to the moisture absorbed by the bank 15.

Although the disclosure has been described by referring to some embodiments, it is not limited thereto but various modifications are possible. For example, although the plurality of line banks 13 and the plurality of banks 15 are provided on the substrate 14 in the above-described embodiments, one pixel bank may be provided with respect to each subpixel 12.

It should be noted that the effects described herein are merely exemplary. The effects of the disclosure are not limited to those described herein. The disclosure may have other effects than those described herein.

It is possible to achieve the following configurations from the disclosure.

(1) An organic electroluminescent panel including:

a plurality of partition walls that define a pixel region, and including an organic material;

an organic light-emitting layer that crosses over the plurality of partition walls; and a protective layer disposed between each of the partition walls and the organic light-emitting layer, and having a moisture permeability lower than a moisture permeability of any of the partition walls.

(2) The organic electroluminescent panel according to (1), further including a plurality of pixels disposed in a matrix form in the pixel region, in which
  each of the pixels includes a plurality of subpixels, and
  the plurality of subpixels are arranged in line in a predetermined direction, are defined by the plurality of partition walls, and share the organic light-emitting layer.
(3) The organic electroluminescent panel according to (2), in which
  the subpixels include and share a hole injection layer, and
  the hole injection layer doubles as the protective layer.
(4) The organic electroluminescent panel according to (3), in which the protective layer covers an entire surface of a portion, of each of the partition walls, that defines the plurality of subpixels.
(5) The organic electroluminescent panel according to (3), in which the protective layer exposes all or a portion of a top surface of each of the partition walls.
(6) The organic electroluminescent panel according to (3), in which the hole injection layer is made of an inorganic material.
(7) The organic electroluminescent panel according to (2), in which
  the subpixels have respective hole injection layers that are separated from each other,
  the hole injection layers each have an end embedded in corresponding one of the partition walls, and
  the protective layer includes a layer that is separated from the hole injection layers.
(8) The organic electroluminescent panel according to (7), in which the protective layer exposes all or a portion of a side surface of each of the partition walls.
(9) The organic electroluminescent panel according to (7), in which the hole injection layer is made of an inorganic material.
(10) The organic electroluminescent panel according to (9), in which the protective layer is made of a metal material.
(11) The organic electroluminescent panel according to (1), in which the organic light-emitting layer includes a coating layer.
(12) The organic electroluminescent panel according to (1), further including a flexible substrate that is in contact with bottom surfaces of the plurality of partition walls, and supporting the plurality of partition walls.
(13) A luminescent unit including:
  an organic electroluminescent panel; and
  a driver that drives the organic electroluminescent panel, the organic electroluminescent panel including
  a plurality of partition walls that define a pixel region, and including an organic material,
  an organic light-emitting layer that crosses over the plurality of partition walls, and
  a protective layer disposed between each of the partition walls and the organic light-emitting layer, and having a moisture permeability lower than a moisture permeability of any of the partition walls.

In the organic electroluminescent panel and the luminescent unit according to an embodiment of the disclosure, the protective layer having the moisture permeability lower than that of the partition wall is provided between the plurality of partition walls and the organic light-emitting layer. The plurality of partition walls define the pixel region and include the organic material, and the organic light-emitting layer crosses over the plurality of partition walls. This makes it difficult for moisture to permeate the partition wall compared with a case in which the protective layer is not formed, and makes it difficult for the moisture in the partition wall to move to the organic light-emitting layer even if the moisture has permeated the partition wall.

The organic electroluminescent panel and the luminescent unit according to an embodiment of the disclosure make it difficult for moisture to permeate the partition wall compared with a case in which the protective layer is not formed, and makes it difficult for the moisture in the partition wall to move to the organic light-emitting layer even if the moisture has permeated the partition wall. Hence, it is possible to suppress any adverse effect due to moisture absorbed by the partition wall.

It should be noted that the effect of the disclosure is not limited to what is described here but may include any effect described in the present specification.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent panel comprising:
  a plurality of partition walls that define a pixel region and include an organic material;
  an organic light-emitting layer that crosses over the plurality of partition walls; and
  a hole injection layer disposed between each of the partition walls and the organic light-emitting layer and having a moisture permeability lower than a moisture permeability of any of the partition walls, the hole injection layer also crosses over at least entire sides of the plurality of partition walls that define the pixel region,
  wherein the hole injection layer covers a portion and exposes a portion of a top surface of each of the partition walls, and
  wherein the hole injection layer doubles as a protective layer.

2. The organic electroluminescent panel according to claim 1, further comprising a plurality of pixels disposed in a matrix form in the pixel region, wherein
  each of the pixels includes a plurality of subpixels, and
  the plurality of subpixels are arranged in line in a predetermined direction, are defined by the plurality of partition walls, and share the organic light-emitting layer.

3. The organic electroluminescent panel according to claim 2, wherein the subpixels include and share the hole injection layer.

4. The organic electroluminescent panel according to claim 3, wherein the hole injection layer covers an entire surface of a portion, of each of the partition walls, that defines the plurality of subpixels.

5. The organic electroluminescent panel according to claim 3, wherein the hole injection layer is made of an inorganic material.

6. The organic electroluminescent panel according to claim 1, wherein the hole injection layer exposes all or a portion of a side surface of each of the partition walls.

7. The organic electroluminescent panel according to claim 6, wherein the hole injection layer is made of an inorganic material.

8. The organic electroluminescent panel according to claim 7, wherein the hole injection layer is made of a metal material.

9. The organic electroluminescent panel according to claim 1, wherein the organic light-emitting layer comprises a coating layer.

10. The organic electroluminescent panel according to claim 1, further comprising a flexible substrate that is in contact with bottom surfaces of the plurality of partition walls, and supporting the plurality of partition walls.

11. A luminescent unit comprising:
- an organic electroluminescent panel; and
- a driver that drives the organic electroluminescent panel, the organic electroluminescent panel including
- a plurality of partition walls that define a pixel region and include an organic material,
- an organic light-emitting layer that crosses over the plurality of partition walls, and
- a hole injection layer disposed between each of the partition walls and the organic light-emitting layer and having a moisture permeability lower than a moisture permeability of any of the partition walls, the hole injection layer also crosses over at least entire sides of the plurality of partition walls that define a plurality of pixels,
- wherein the hole injection layer covers a portion and exposes a portion of a top surface of each of the partition walls, and
- wherein the hole injection layer doubles as a protective layer.

* * * * *